United States Patent [19]

Shimizu

[11] Patent Number: 4,555,663
[45] Date of Patent: Nov. 26, 1985

[54] TEST PATTERN GENERATING APPARATUS

[75] Inventor: Masao Shimizu, Gyoda, Japan

[73] Assignee: Takeda Riken Co., Ltd., Tokyo, Japan

[21] Appl. No.: 552,374

[22] Filed: Nov. 16, 1983

[30] Foreign Application Priority Data

Nov. 19, 1982 [JP] Japan .................. 57-203878

[51] Int. Cl.<sup>4</sup> ............... G01R 31/28; G06F 11/00
[52] U.S. Cl. ................................ 324/73 R; 371/27
[58] Field of Search ............ 324/73 R, 73 AT; 371/27, 25; 364/717, 718

[56] References Cited

U.S. PATENT DOCUMENTS 4,293,950 10/1981 Shimizu et al. ............... 371/27
4,388,719 6/1983 Soltysik et al. ............... 324/73 R

OTHER PUBLICATIONS

Legnard et al.; "Pattern Generating System"; IBM Tech. Dis. Bull.; vol. 14; No. 2; Jul. 1971; pp. 482–484.

Primary Examiner—Ernest F. Karlsen
Attorney, Agent, or Firm—Staas & Halsey

[57] ABSTRACT

A word of a test pattern is divided into blocks and stored in a storage device of a test pattern generator for testing a logic device. The test pattern blocks are sequentially provided to respective blocks of a pattern generator, which provides at respective outputs all of the blocks of a test pattern word at the same time. If a block of the pattern generator is faulty, or if another component of the test pattern generator corresponding to a block of the pattern generator is faulty, the respective block of each test pattern word can be provided to an unused block of the pattern generator, for providing the test patterns for testing the logic device without the need for reprogramming the test pattern blocks to be stored in the storage device. The data stored in the storage device identifies the position of each respective block of the test pattern words, for controlling the transferring of the test pattern blocks from the storage device to the pattern generator.

5 Claims, 4 Drawing Figures

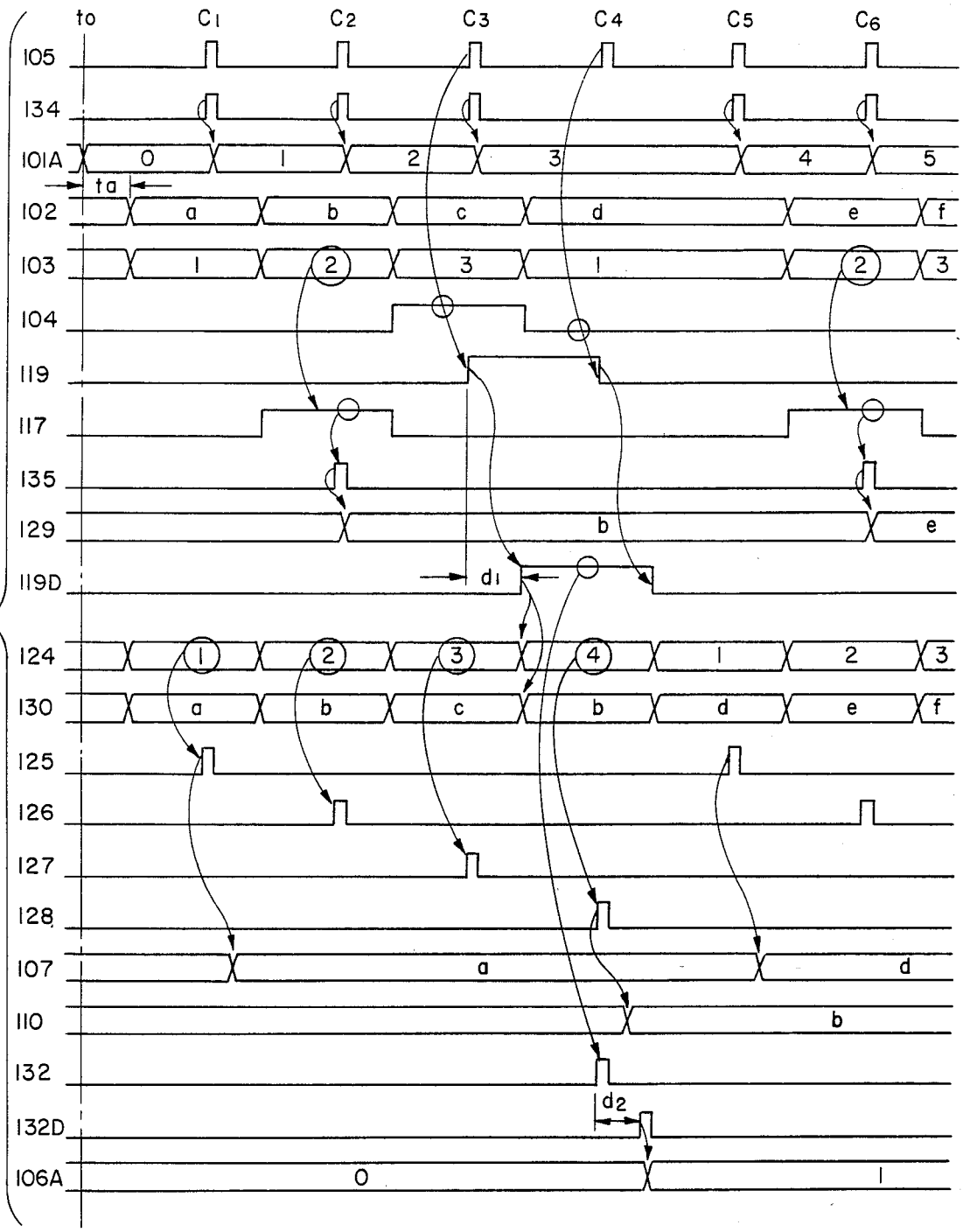

TEST PATTERN GENERATING APPARATUS

BACKGROUND OF THE INVENTION

This invention relates to a test pattern generating apparatus which generates test patterns for testing a logic circuit such as a semiconductor integrated circuit, and especially to a test pattern generating apparatus wherein test patterns from a storage device are transferred and stored in an unused block of a pattern generator when part of a logic circuit test equipment is broken down.

In testing a logic circuit, a test pattern is supplied to the logic circuit under test, and the resulting output from the logic circuit is compared with an expected pattern to determine whether the logic circuit works correctly or not. The pattern length and the word length of the test pattern and the expected pattern supplied to the logic circuit under test increase with increase in scale and density of the logic circuit under test. For example, for testing a logic circuit having 256 pins, a test pattern including the expected pattern is required to have a 256-bit word. Further, the pattern length for testing a 64K memory, for example, needs to be $3 \times 64K^2$ steps in an algorithmic test pattern, such as in galloping and walking test patterns. Further, the test patterns are required to be generated with high speed in view of to the recent developments in speed of the logic circuits which are to be tested.

The test pattern as above cannot be directly generated by a storage device as is usually employed in a CPU system. Therefore, in a logic circuit test equipment there are provided a storage device of large capacity and relatively low speed, such as a disc memory, and a pattern generator of high speed, relatively small capacity and large word length. The test patterns including the expected pattern are previously provided from the storage device in predetermined amounts, and stored in the pattern generator, since a pattern generator of large capacity and high speed is very expensive. When testing the logic circuit, the pattern generator supplies the test pattern to the logic circuit under test and the expected pattern to comparators for evaluating the outputs from the logic circuit.

FIG. 1 shows a block diagram of a general construction of a logic circuit test equipment of this kind. A storage device 1 which has a large capacity of storage locations provides in advance test patterns and expected patterns to a pattern generator 2. The pattern generator 2 generates test patterns 13 and expected patterns 14 in parallel to each other when testing a logic circuit. The test patterns are supplied to a group of formatters 3 in which the test patterns are shaped to predetermined logic waveforms such as return-to-zero (RZ), non-return-to-zero (NRZ) waveforms and so forth. The test patterns delivered by the formatter 3 are provided to a group of drivers 4 which determine the voltage levels of the test patterns according to a logic circuit 5 that is being tested. The test patterns from the group of drivers 4 are supplied to a group of terminals 11 of the logic circuit 5.

Outputs from a group of terminals 12 of the logic circuit 5 are supplied to a group of logic decision circuits 7 for determining whether the outputs are at high or low logic level. The results from the group of logic decision circuits 7 are fed to a group of logic comparators 6 whose other input terminals are supplied with corresponding expected patterns 14 from the pattern generator 2. Thus the logic comparators $6_1$ to $6_n$ compare the respective outputs from the group of logic decision circuits 7 with the expected patterns and provide the comparison results to a bus line 10 which is connected to a central processing unit (CPU, not shown). When there is any difference between the signals from the logic circuit 5 being tested and the expected patterns, the logic circuit 5 is rejected.

The storage device 1 stores test patterns by dividing each word of the test patterns into a plurality of blocks each of which has a plurality of bits, for example 16 bits for each block, and provides the divided test patterns to the pattern generator 2 before beginning a test. The data is set in the storage device 1 by means of programming. In FIG. 1 each word of the test patterns is divided into three successive blocks, for instance the first 48-bit word is divided into blocks a, b and c, the second word is divided into blocks d, e and f . . . , with each block having a 16-bit length. The blocks of each word of the test pattern from the storage device 1 are stored in corresponding blocks 17, 18 and 19 of the test pattern generator 2 as in FIG. 1.

In this way the test patterns are transformed and stored in the pattern generator 2 by predetermined amounts, so that the test patterns can be generated during the test one word at a time. Thus test patterns with large-bit words can be generated sequentially at high speed by accessing the pattern generator 2, since the pattern generator 2 has high speed and a large-bit word memory.

However, in this logic circuit test equipment, in the event of a defect arising in the circuit components, such as in the formatters, drivers, comparators, etc. or in the blocks of the pattern generator 2, the logic circuit test has to be stopped until the defect is repaired. When testing a logic circuit which has a smaller number of terminals than the maximum number of terminals which can be accommodated by the logic circuit test equipment, the test equipment has unused blocks in the pattern generator and also in the other circuit components. Accordingly, there is a possibility of testing the logic circuit without repairing the abovesaid defect by changing the portions of the test patterns, that is originally intended to be stored in a block of the test pattern generator corresponding to the defective part, to an unused block of the pattern generator 2; and of changing the corresponding circuit connection of the formatters and the like to the unused ones by using switches, for instance. However, for doing this, it is necessary to alter the contents in the storage device 1 for supplying and storing the test pattern in the unused blocks of the pattern generator 2, and thus quite a long time is required for programming.

SUMMARY OF THE INVENTION

It is an object of the present invention to provide a test pattern generating apparatus which is capable of generating test patterns including expected patterns to test a logic circuit continuously even if a defect arises in a pattern generator or in a circuit arrangement disposed between the test pattern generating apparatus of the test equipment and the logic circuit under test.

It is another object of the present invention to provide a test pattern generating apparatus which is capable of generating test patterns including expected patterns without changing programs when a defect arises in the circuit portion of the test equipment.

According to this invention, registers are provided for storing fault block data, indicating the block position of a pattern generator corresponding to a faulty part of the logic circuit test equipment, and unused block data indicating the position of the unused blocks of the pattern generator. A test pattern including an expected pattern (hereinafter both will be referred to simply by test pattern) is divided into a plurality of blocks that are read out along with block data and a last block data from a storage device, for storing the test patterns in the pattern generator prior to a logic circuit test. The block data from the storage device indicates the block position of the pattern generator wherein each block of each divided test pattern is to be stored, and the last block data indicates when a test pattern block that is being read out from the storage device is the last block of a word of a test pattern.

When the block data does not agree with the fault block data stored in the respective register, then the blocks of the test patterns are sequentially transferred to and stored in the corresponding blocks of the pattern generator specified by the block data. If the block data from the storage device coincides with the fault block data, a block of a test pattern corresponding to the fault block data is temporarily stored in another register provided in this invention. When the last block data is read out from the storage device the temporarily stored test pattern is loaded in the unused block of the pattern generator.

In this manner, the test patterns from the storage device are written into the pattern generator, while storing the blocks of the test patterns corresponding to the faulty parts of the test pattern generating apparatus into unused blocks of the pattern generator. Thus, after storing the test pattern in the patterns generator, a logic circuit test can be continued, even if any fault occurs in the circuit arrangements between the pattern generator and the logic circuit under test, or in the pattern generator itself, by simply changing the circuit connections. That is, it is enough to change the block of the circuit including the faulty part to the unused blocks of the circuits. Therefore, according to this invention, it is not necessary to change the test patterns stored in the storage device when a defect occurs in a logic circuit test equipment. In other words, according to this invention, even if some fault occurs in the test equipment, the required test pattern can be prepared in the pattern generator and supplied to the logic device to be tested, for loading the storage device without changing the program.

BRIEF DESCRIPTION OF THE DRAWINGS

FIGS. 4-105 to 4-106A are timing charts for explaining the operation of the embodiment of FIG. 3.

DETAILED DESCRIPTION OF THE PREFERRED EMBODIMENT

Figure 2:
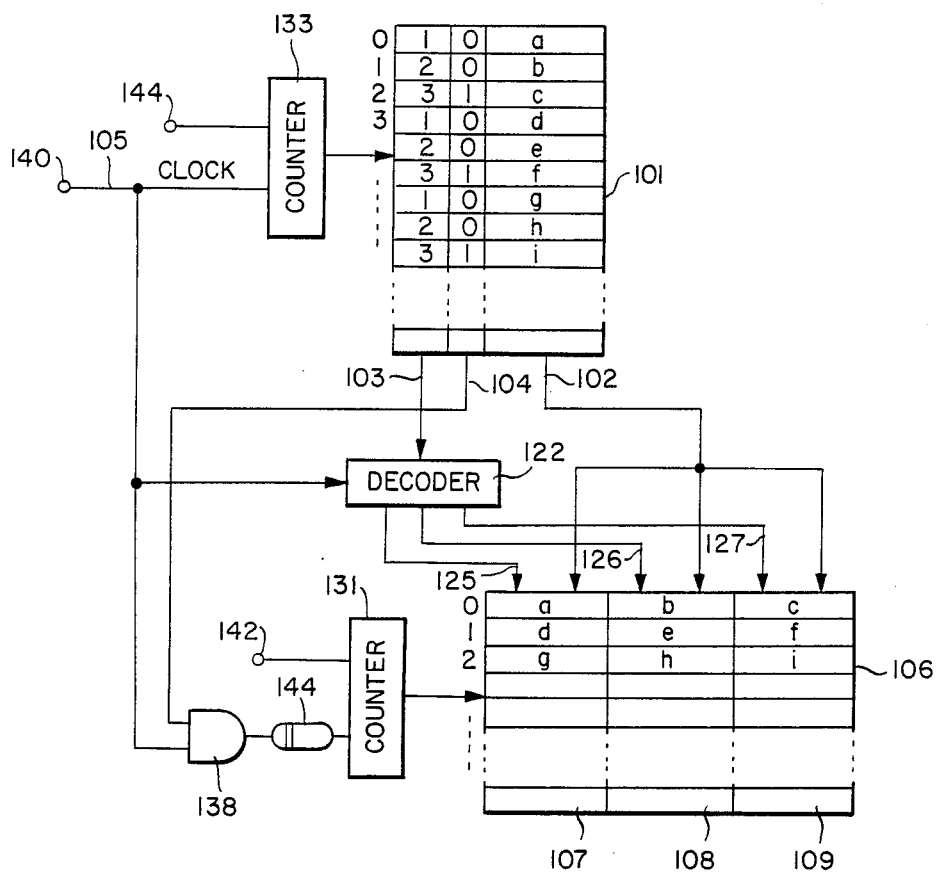
FIG. 2 is a circuit diagram showing a conventional test pattern generating apparatus.

To facilitate a better understanding of the present invention, a description will be given of a conventional test pattern generating apparatus. FIG. 2 shows a circuit diagram of a conventional test pattern generating apparatus.

A storage device 101 stores test patterns by dividing each word into a plurality of separate blocks. The storage device 101 is a relatively low speed and large capacity memory generally employed with a CPU system. Before starting a logic circuit test, a predetermined amount of the test patterns is transferred to a pattern generator 106. The pattern generator 106 is a high speed memory of relatively small capacity and large word length.

In a logic circuit test equipment, test patterns with a large number of bits per word are required corresponding to the number of terminals of a logic circuit to be tested. For example, a test pattern represented by a 128-bit word is required to test a 128-pin logic circuit. The test patterns have to be generated with high speed for evaluating a logic circuit of high speed. Further, the length of each test pattern is quite large for the complicated and high density logic circuits to be tested. Since a pattern generating apparatus having large capacity and high speed is very expensive, the storage device and the pattern generator as above are provided at one time for generating only a predetermined amount of the test pattern, since the entire test pattern is not required at the same time for evaluating the logic circuit under test.

A program counter 133 provides an address to the storage device 101 in synchronism with a clock signal 105 supplied at a terminal 140. An initial address to be output from the program counter 133 is determined by an initial data at the terminal 141. By the addresses from the program counter 133, the divided test pattern 102 (a,b,c,d,e,f,g . . . ), the block data 103 (1,2,3,1,2,3 . . . ) and the last block data 104 (0,0,1,0,0,1,0 . . . ) are respectively read out. In this example, one word is divided into three blocks, that is, three blocks of test patterns (a,b,c) for example, constitute one word of the test pattern. The divided test patterns 102 are commonly supplied to a plurality of blocks 107 to 109 of the pattern generator 106. The block data 103 are provided to a decoder 122 which generates write pulses 125, 126, 127 in synchronism with the clock signal 105 in response to the block data. The write pulses 125, 126 and 127 are provided to the corresponding blocks 107, 108, 109 of the pattern generator 106.

The last block data 104 is provided to an AND gate 138 whose other input terminal is supplied with the clock signal 105. When the last block data is at high level, the clock signal 105 is supplied to a program counter 131 through a delay circuit 144. The program 131 provides an address to the pattern generator 106 in synchronism with the delayed clock signal from the delay circuit 144. An initial address of the pattern generator 106 is determined by an initial data at a terminal 142.

At the beginning of the operation, in this example, both program counters 131 and 133 are set to the address 0 by the initial data from the terminals 142 and 141, respectively. By the address 0 given to the storage device 101, a test pattern a, the block data 1 and the last block data 0 are respectively read out, after the access time of the storage device 101. The test pattern a is commonly given to the three blocks 107, 108, 109 of the pattern generator 106. Since the block data indicates 1, the decoder 122 provides a write pulse 125 to the block 107 in synchronism with the clock signal 105. Accordingly, the test pattern a is written into the address 0 of the block 107.

In the next cycle, the address 1 is generated by the program counter 133 in synchronism with the clock signal 105, so that the divided test pattern b, the block data 2 and the last block data 0 are read out. This time the test pattern b is stored in the address 0 of the block 108 of the pattern generator 106 by the write pulse 126 from the decoder 122, since the block data specifies the second block position. In the subsequent cycle, by an address 2 from the program counter 133, the divided test pattern c, the block data 3 and the last block data 1 are read out. Therefore, in this example, the block 109 of the pattern generator 106 is assumed to be the last block. Since the block data is 3, the decoder 122 provides the write pulse 127 to the block 109 and the test pattern block c is written into the address 0 of the block 109. At the same time, because the last block data indicates 1, the AND gate 138 is opened to provide the clock signal 105 to the program counter 131 via the delay circuit 144. The program counter 131 generates an address 1 in synchronism with the delayed clock signal, and thus the address 1 of the pattern generator 106 is selected. Namely the delay time of the delay circuit 144 is selected to obtain enough time for writing the test pattern block c into the block 109. In the next cycle, the storage device 101 is accessed by the address 3 from the program counter 133, and thusly the test pattern d is written into the address 1 of the block 107.

By repeating the above sequence for a predetermined number of times, the test patterns divided into three blocks are sequentially transferred to the pattern generator 106. During the logic circuit test, the test patterns are generated from the pattern generator 106 one word at a time by accessing the pattern generator 106.

Figure 1:
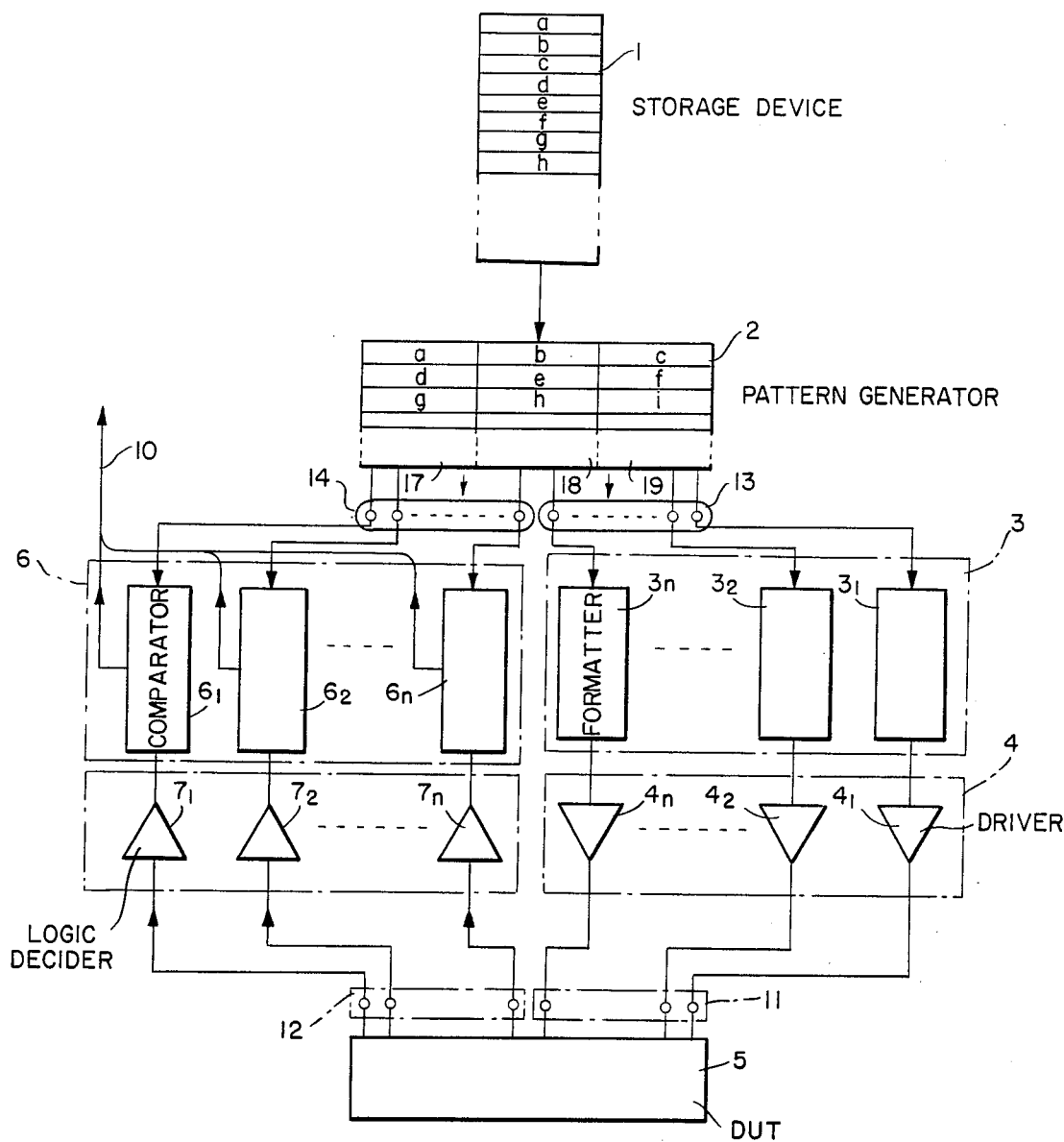
FIG. 1 shows a block diagram of a conventional logic circuit test equipment including a test pattern generating apparatus.

In this conventional test pattern generating apparatus, it is impossible to continue the logic circuit test if some fault occurs in the pattern generator 106 or in the circuit arrangements between the pattern generator 106 and the logic circuit under test, such as in the formatters, drivers, etc. shown in FIG. 1. Normally when using the logic circuit test equipment, except when testing a logic circuit having the maximum number of pins that are capable of being tested by the test equipment, there is an unused portion. For instance, when testing a 64-pin logic circuit by a test equipment which is capable of testing a logic circuit having up to 128 terminal pins, there is an unused portion of the test equipment corresponding to the unused 64-pin capacity. Therefore, it is possible to test the logic circuit under test by changing the circuit connection involving a faulty part to an unused part, and also by changing the test pattern from the block corresponding to the faulty part of the pattern generator 106 to a block corresponding to an unused part. However for changing the test pattern to an unused block of the pattern generator 106, it is necessary to change the data in the storage device 101, in order to transfer the respective parts of the test patterns to the new block position of the pattern generator. Thus, in the conventional pattern generating apparatus, quite a long time is required to program for storing the new data in the storage device 101.

Figure 3:
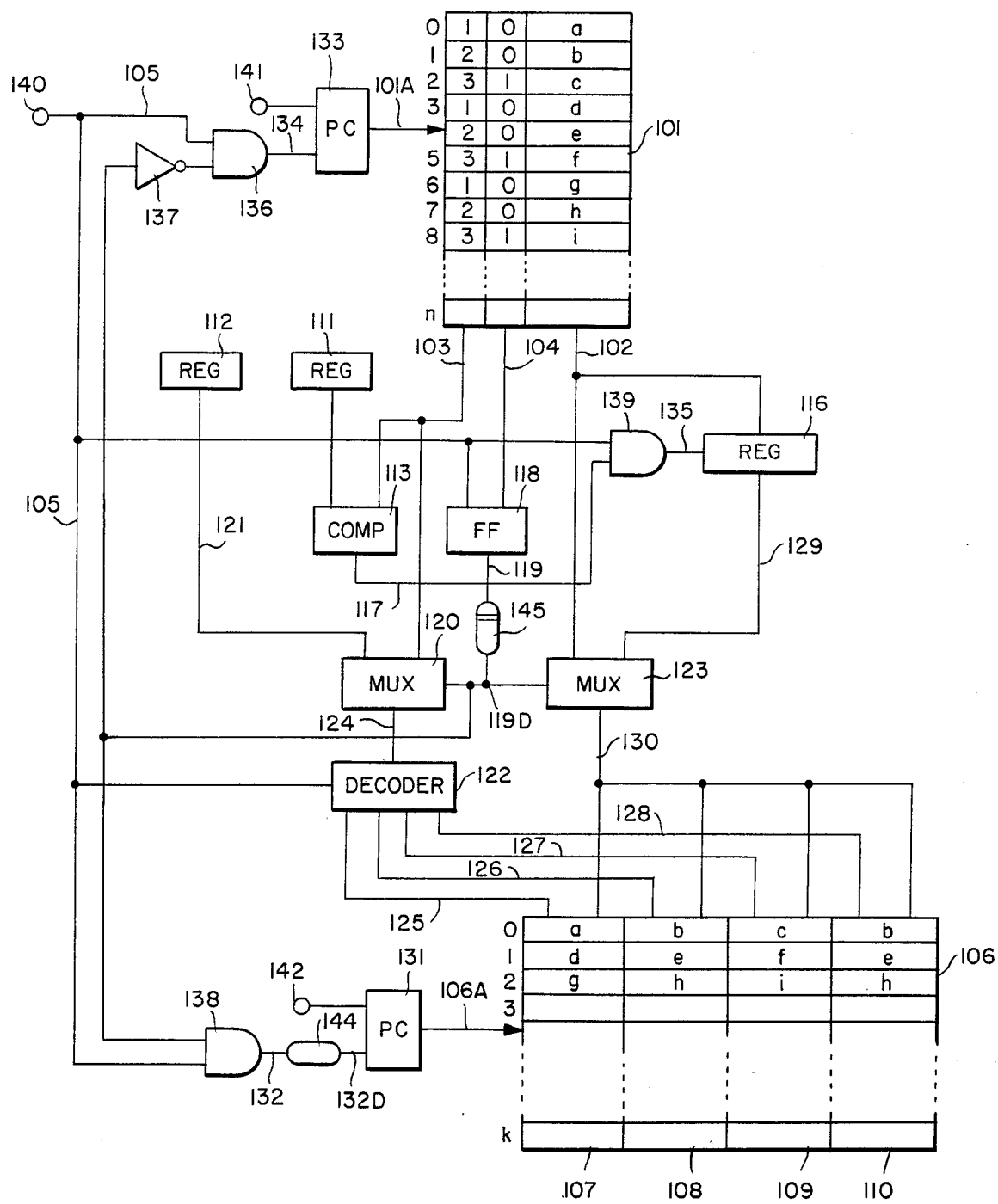
FIG. 3 is a circuit diagram showing a test pattern generating apparatus according to the present invention.

FIG. 3 shows a circuit diagram of a preferred embodiment of the present invention. In FIG. 3 the components that are identical to those in FIG. 2 are denoted by the same reference characters. A storage device 101 is accessed by the address 101A from a program counter 133 so the that blocks of the test pattern 102, the block data 103 and the the last block data 104 are respectively read out. The program counter 133 generates the address 101A in synchronism with a clock signal 105 at the terminal 140, after being initialized by the initial data at the terminal 141. The test pattern 102 blocks are supplied to a multiplexer 123 and a register 116. The block data 103 is given to a comparator 113 and a multiplexer 120. The last block data 104 is provided to a flip-flop 118.

A register 111 stores fault block data indicating the position of a block in a pattern generator 106 corresponding to a faulty part that exists in a logic circuit test equipment. The fault block data from the register 111 is supplied to the other terminal of the comparator 113. A register 112 stores unused block data indicating the position of the unused blocks of the pattern generator and other circuit components of the test equipment. The comparator 113 generates a coincidence signal when the block data 103 from the storage device 101 and the fault block data from the register 111 coincide with each other. By the coincidence signal from the comparator 113, an AND gate 139 is opened so that the clock signal 105 is provided to the register 116 to serve as a read pulse 135. By the read pulse 135 the register 116 takes in the test pattern block 102 specified by the fault block data and temporarily holds it until the next read pulse 135 is supplied. The flip-flop 118 takes in the last block data in synchronism with the clock signal 105, and provides the last block data to the multiplexers 120 and 123 via a delay circuit 145.

The multiplexer 120 selects either the block data 103 or the unused block data 121 and provides it to a decocer 122. Namely, in the case that a signal 119D from the delay circuit 145 is at low level, the block data 103 is selected, whereas, in the case that the signal 119D is at high level, the unused block data 121 from the register 112 is selected. In accordance with the data from the multiplexer 120, the decoder 122 selectively provides write pulses 125 to 128 respectively to the blocks 107 to 110 of the pattern generator 106 in synchronism with the clock signal 105. The multiplexer 123 selects either the test pattern 102 from the storage device 101, or the test pattern 129 temporarily stored in the register 116. Namely, when the signal 119D from the delay circuit 145 is at low level the test pattern block 102 is selected, and when the signal 119D is at high level the test pattern block 129 is selected. The selected test pattern block 130 from the multiplexer 123 is commonly supplied to the blocks 107 to 110 of the pattern generator 106, and is written into the selected block when either one of the write pulses 125 to 128 is supplied to the selected block.

An AND gate 138 is arranged for providing the clock signal 105 to a program counter 131 via a delay circuit 144 when the signal 119D from the delay circuit 145 is at high level. Thus the program counter 131 increments to produce a new address, after completion of the storing of the blocks of each test pattern word in the respective blocks of the pattern generator 106 having the same respective address. An inverter 137 and an AND gate 136 are provided for inhibiting the clock signal 105 from being supplied to the program counter 133 when the signal 119D from the delay circuit 145 is at high level, so that the program counter 133 is stopped from incrementing for one cycle.

The further detailed operation of the embodiment of FIG. 3 will be described with reference to the timing charts shown in FIGS. 4-105 to 4-106A, which, together with FIG. 3, illustrate the case wherein a fault occurs in the circuit components corresponding to the block 108 of the pattern generator 106 and the unused block in the test equipment corresponds to the block 110 of the pattern generator 106. Thus, in this case the test pattern that was to be stored in the block 108 has to be transferred to the block 110.

Before starting the operation, the fault block data 2 is set in the register 111 and the unused block data 4 is set in the register 112. Also, the flip-flop 118 is reset so that its output is at low level. At the start of the operation, at the time $t_0$, both program counters 131 and 133 are set to initial states, in this example to the address 0, by the initial data from the terminals 142 and 141, respectively. Thus the program counter 131 provides the address 0 to the pattern generator 106 and the program counter 133 provides the address 0 to the storage device 101.

Since the address 101A from the program counter 133 indicates 0, the contents in the address 0 of the storage device 101 are read out after an access time $t_a$. Therefore, the test pattern block a, the block data 1 and the last block data 0 are read out as each respective data 102, 103, and 104. The block data 1 is provided to the decoder 122 by the multiplexer 120, since the output 119 of the flip-flop 118 and thus the signal 119D from the delay circuit 145, are at low level. The test pattern a is selected by the multiplexer 123, since the signal 119D is at low level, and is provided to all the blocks 107 to 110 of the pattern generator 106. Because the block data indicates 1, the decoder 122 gives the write pulse 125 to the block 107 in synchronism with the first pulse $c_1$ of the clock signal 105. Accordingly, the test pattern a is written into the address 0 of the block 107.

The state of the flip-flop 118 is not changed when the first pulse $c_1$ of the clock signal 105 is supplied, because the last block data 104 indicates 0, and thus the signal 119D from the delay circuit 145 stays at low level. Since the signal 119D is at low level, a clock signal 134 caused by the first pulse $c_1$ of the clock signal 105 is fed to the program counter 133 through the AND gate 136. Thus the program counter 133 is incremented by one step and produces the address 1. By the address 1 from the program counter 133, the test pattern block b, the block data 2 and the last block data 0 are respectively read out from the storage device 101, after the access time $t_a$. Since the signal 119D from the delay circuit 145 is at low level, the multiplexer 120 selects the block data 103 indicating the second block and provides it to the decoder 122. The test pattern b is supplied to each of the blocks 107 to 110 through the multiplexer 123 because of the low level of the signal 119D. The decoder 122 generates the write pulse 126 in synchronism with the second pulse $c_2$ of the clock signal 105 and provides it to the block 108. Thus the pattern data b is written into the address 0 of the block 108.

Since the block data indicating the second block from the storage device 101 and the fault block data from the register 111 coincide with each other, the comparator 113 produces a coincidence signal 117 so that the AND gate 139 is opened. Therefore, the test pattern b is taken into the register 116 by a read signal 135 synchronized with the second pulse $c_2$. Thus the output 129 of the register 116 becomes the test pattern b, which is provided to the multiplexer 123. The signal 119D is at low level when the second pulse $c_2$ of the clock signal 105 is generated, and thus, by the second pulse $c_2$ of the clock signal 134, the program counter 133 is incremented by one step and the address 101A becomes the address 2. Accordingly, the test pattern c, the block data 3 and the last block data 1 are read out from the storage device 101 after the access time $t_a$. In this case, the last block data 104 indicates high level, that is, the third block 109 is considered to be the last block in this example.

The high level of the last block data is taken into the flip-flop 118 by the third pulse $c_3$ of the clock signal 105. The output of the flip-flop 118 goes to high level in synchronism with the third pulse $c_3$ of the clock signal 105 and is provided to the delay circuit 145, whereby the delayed signal 119D is produced. The block data indicating 3 is provided to the decoder 122 through the multiplexer 120, and thusly the pattern data c is written into the address 0 of the block 109 by the write pulse 127 according to the third pulse $c_3$ of the clock signal 105, since the signal 119D is not yet at high level. In other words, the delay time $d_1$ of the delay circuit 145 is selected to add enough time, for writing the test pattern c into the block 109 of the pattern generator 106, to the output signal 119 of the flip-flop 118. Since the signal 119D is at low level at the time when the third pulse $c_3$ is generated, the clock pulse 134 is provided to the program counter 133, so that the program counter 133 generates the address 3. When accessed by the address 3, the storage device 101 provides the test pattern d, the block data 1 and the last block data 0.

When the signal 119D becomes high level, the multiplexer 120 selects the unused block data indicating the fourth block 110 and the multiplexer 123 selects the data 129 from the register 116 indicating the test pattern b. Thus the decoder 122 generates the write pulse signal 105, and provides it to the unused block 110 of the pattern generator 106. Accordingly, the test pattern b is written into the address 0 of the block 110.

During the time which the signal 119D is at high level, the AND gate 136 is closed so that the clock signal 134 corresponding to the fourth pulse $c_4$ is inhibited. Therefore, the program counter 133 is stopped from incrementing for one cycle. By the high level of the signal 119D the AND gate 138 is opened, so that the clock signal 105 is supplied to the program counter 131 through the delay circuit 144. Namely, the clock signal 132 from the AND gate 138 corresponding to the fourth pulse $c_4$ of the clock signal 105 is provided to the delay circuit 144, whereby the delayed clock signal 132D is produced. The program counter 131 is incremented by the delayed clock signal 132D, so that the address 1 of the pattern generator 106 is accessed. The delay time $d_2$ of the delay circuit 144 is selected for obtaining enough time for writing the test pattern b into the block 110, after the providing of the write pulse 128.

By the fourth pulse $c_4$ of the clock signal 105, the output 119 of the flip-flop 118 is changed to low level, since the last block data from the address 3 of the storage device 101 indicates 0. After the delay time $d_1$, the signal 119D goes to low level so that the AND gate 136 is opened. Therefore, by the clock signal 134 which is synchronized with the fifth pulse $c_5$ of the clock signal 105, the program counter 133 is incremented by one step and provides the address 4 to the storage device 101. At the same time, the test pattern d is written into the address 1 of the block 107 of the pattern generator 106 by the write pulse 125. In this way, the above sequence is repeated, and the test patterns corresponding to the fault block 107 are transferred to the unused block 110 of the pattern generator 106.

As has been mentioned above, according to this invention, even though some fault occurs in the test equipment, the required test pattern can be prepared in the pattern generator without changing the data in the storage device. As a consequence, it is not necessary to program for storing new data in the storage device, which allows a great savings in time.

What is claimed is:

1. A test pattern generating apparatus for providing test patterns for testing a logic circuit, comprising a storage device for storing words corresponding to said test patterns, wherein each said word is divided into a plurality of test pattern blocks, and for storing block data indicating the position of each said block in each respective word and last block data indicating the last one of said test pattern blocks of each said word, a pattern generator for storing said test pattern blocks that are provided from the storage device, and for outputting each said word one at a time during said testing of the logic circuit, fault register means for storing fault block data indicating the position of at least one of said blocks of said pattern generator, corresponding to at least one respective fault of test pattern generating apparatus, unused-block register means for storing unused block data indicating the position of at least one respective unused block of said pattern generator, a comparator for comparing the block data provided from the storage device with the fault block data provided from the fault register means, further register means for storing each respective one of said test pattern blocks that is provided from the storage device upon each coincidence of the block data and the fault block data detected by said comparator, and means for transferring the test pattern block corresponding to each said fault to each respective unused block of the pattern generator that is specified by the unused block data from the unused-block register means.

2. A test pattern generating apparatus for providing test patterns for testing a logic circuit, comprising a storage device for storing words representing selected test patterns, wherein each said word is divided into a first plurality of test pattern blocks and each said test pattern block is stored at a different address of said storage device for selected sequential output of said test pattern blocks including from successively incremented addresses of said storage device, a pattern generator having a plurality of addresses for respectively storing said words output from said storage device, wherein each said address is divided into a plurality of pattern generator blocks that is larger than said first plurality of test pattern blocks, each respective one of said test blocks having a corresponding respective one of said pattern generator blocks, and means for selectively transferring to at least one other respective selected pattern generator block, other than said corresponding pattern generator blocks, at least one respective one of said test pattern blocks of each said test pattern word that is stored in said pattern generator, so as to provide said test patterns from said pattern generator for testing said logic circuit, while maintaining unchanged said test pattern blocks stored in said addresses of said storage device.

3. The apparatus of claim 2, wherein said storage device stores order data identifying the position of each said test pattern block in each said word, and outputs said order data for controlling the pattern generator blocks into which said test pattert blocks are stored.

4. The apparatus of claim 3, wherein said order data includes block data specifying the position of each said test pattern block within each said word to be output to said pattern generator, and last block data specifying each said test pattern block which is the last test pattern block of each said word.

5. The apparatus of claim 1 or 4, wherein said block data causes at least one respective test pattern block to be stored in each said other pattern generator block of said pattern generator, after the last test pattern block of the respective word is output from said storage device.

* * * * *